US012604397B2

(12) United States Patent
Varjos et al.

(10) Patent No.: US 12,604,397 B2
(45) Date of Patent: Apr. 14, 2026

(54) METHOD OF MANUFACTURING A FORMED FILM

(71) Applicant: CANATU OY, Vantaa (FI)

(72) Inventors: Ilkka Varjos, Vantaa (FI); Sari Tamminen, Vantaa (FI)

(73) Assignee: CANATU OY, Vantaa (FI)

( * ) Notice: Subject to any disclaimer, the term of this patent is extended or adjusted under 35 U.S.C. 154(b) by 413 days.

(21) Appl. No.: 17/785,007

(22) PCT Filed: Dec. 10, 2020

(86) PCT No.: PCT/FI2020/050828
§ 371 (c)(1),
(2) Date: Jun. 13, 2022

(87) PCT Pub. No.: WO2021/116532
PCT Pub. Date: Jun. 17, 2021

(65) Prior Publication Data
US 2023/0014968 A1     Jan. 19, 2023

(30) Foreign Application Priority Data
Dec. 13, 2019     (FI) ...................................... 20196084

(51) Int. Cl.
*H05K 1/02*          (2006.01)
*H05K 3/00*          (2006.01)
*H05K 3/12*          (2006.01)

(52) U.S. Cl.
CPC ......... *H05K 1/0281* (2013.01); *H05K 3/0014* (2013.01); *H05K 3/1291* (2013.01);
(Continued)

(58) Field of Classification Search
CPC ......... H05K 1/0281; H05K 2201/0129; H05K 2201/0133; H05K 2201/0145;
(Continued)

(56) References Cited

U.S. PATENT DOCUMENTS 6,528,892 B2     3/2003  Caletka et al.
9,431,147 B2     8/2016  Dorfman
(Continued)

FOREIGN PATENT DOCUMENTS

EP          2903043 A2 *  8/2015  ........... C23C 24/082
EP          3528602 A1      8/2019
(Continued)

OTHER PUBLICATIONS

International Search Report for Application No. PCT/FI2020/050828, mailed Mar. 1, 2021, 3 pages.
(Continued)

*Primary Examiner* — Minh N Trinh
(74) *Attorney, Agent, or Firm* — Lippes Mathias LLP

(57)          ABSTRACT
A method for manufacturing a formed film including providing a formable film having a conductive pattern on a first side of the formable film. The method may further comprise printing a deformation-preventing element onto the formable film and forming at least one section of the formable film at a forming temperature. A modulus of elasticity of the deformation-preventing element at the forming temperature may be greater than a modulus of elasticity of the formable film at the forming temperature.

13 Claims, 5 Drawing Sheets

(52) U.S. Cl.
CPC ................ *H05K 2201/2009* (2013.01); *H05K*
*2203/1105* (2013.01); *H05K 2203/1131*
(2013.01)

(58) Field of Classification Search
CPC ... H05K 2201/0154; H05K 2201/0158; H05K
2201/017; H05K 2201/0175; H05K
2201/2009; H05K 2203/0514; H05K
2203/1105
See application file for complete search history.

(56) References Cited

U.S. PATENT DOCUMENTS

| | | | |
|---|---|---|---|
| 10,282,011 B2 | 5/2019 | McMillen | |
| 2005/0206047 A1* | 9/2005 | Lewison .............. | H05K 3/0014 |
| | | | 264/553 |
| 2008/0020504 A1* | 1/2008 | Raghurama .......... | G01N 27/127 |
| | | | 438/48 |
| 2008/0303145 A1 | 12/2008 | Takizawa et al. | |
| 2013/0148315 A1 | 6/2013 | Dabov | |
| 2014/0350161 A1 | 11/2014 | Dorfman | |
| 2015/0257278 A1 | 9/2015 | Niskala et al. | |
| 2016/0172741 A1* | 6/2016 | Panat ..................... | H01F 27/24 |
| | | | 29/600 |
| 2016/0316570 A1* | 10/2016 | De Vaan ............. | H05K 3/0014 |
| 2017/0019988 A1 | 1/2017 | McGrane et al. | |
| 2017/0298242 A1 | 10/2017 | Mostowy-Gallagher et al. | |
| 2018/0279467 A1 | 9/2018 | Kamakura | |
| 2019/0028442 A1 | 1/2019 | Pillai et al. | |
| 2023/0014968 A1* | 1/2023 | Varjos ................. | H05K 3/1291 |

FOREIGN PATENT DOCUMENTS

| | | | | | |
|---|---|---|---|---|---|
| FR | 2754416 | A1 | 4/1998 | | |
| GB | 2266999 | A | 11/1993 | | |
| JP | 5327192 | A | 12/1993 | | |
| JP | 2012231018 | A | 11/2012 | | |
| JP | 2016021555 | A | 2/2016 | | |
| KR | 100671748 | B1 | 1/2007 | | |
| KR | 10-2007-0033329 | A | 3/2007 | | |
| KR | 10-1541618 | B1 | 8/2015 | | |
| TW | 201810583 | A * | 3/2018 | ............ | G02F 1/133 |
| WO | 198701557 | A1 | 3/1987 | | |
| WO | 200187503 | A1 | 11/2001 | | |
| WO | 2007130870 | A2 | 11/2007 | | |
| WO | 2016145309 | A1 | 9/2016 | | |
| WO | 2018168243 | A1 | 9/2018 | | |
| WO | 2019160417 | A1 | 8/2019 | | |

OTHER PUBLICATIONS

International Preliminary Report on Patentability for Application No. PCT/FI2020/050828, mailed Dec. 15, 2021, 16 pages.
Finnish Office Action for Application No. 20196084, dated Nov. 10, 2021, 7 pages.
Finnish Search Report for Application No. 20196084, dated Jul. 13, 2020, 2 pages.
https://www.designhmi.com/2017/03/25/dupont-in-mold-electronics, "In Mold Electronic Application Design", Mar. 25, 2017, 17 pages.
Office Action for Korean Patent Application No. 10-2022-7017506, dated May 26, 2025, 21 pages.
Office Action for Japanese Patent Application No. 022-535741, dated Oct. 29, 2024, 3 pages.

* cited by examiner

METHOD OF MANUFACTURING A FORMED FILM

TECHNICAL FIELD

The present disclosure relates to a formed film, and more particularly to a method for manufacturing a formed film, a formed film, and an electronic device.

BACKGROUND

In-mould electronics may enable structural electronics where the electronics are part of the structure itself. A printed circuit board (PCB) may for example be replaced with a film comprising conductive traces and electronic components that would previously be placed onto a PCB. The film may then be formed into desired shapes for the device in question.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object to provide a formed film and a method for manufacturing a formed film. The foregoing and other objects are achieved by the features of the independent claims. Further implementation forms are apparent from the dependent claims, the description and the figures.

According to a first aspect, a method for manufacturing a formed film comprises: providing a formable film having a conductive pattern on a first side of the formable film; printing a deformation-preventing element onto the formable film; and forming at least one section of the formable film at a forming temperature; wherein a modulus of elasticity of the deformation-preventing element at the forming temperature is greater than a modulus of elasticity of the formable film at the forming temperature. The method may enable, for example, reducing deforming of the formable film at areas close to and/or covered by the deformation-preventing element.

In an implementation form of the first aspect, the forming the at least one section of the formable film at the forming temperature comprises: thermoforming the at least one section of the formable film at the forming temperature; and/or injection moulding a structure onto the formable film. The method may enable, for example, thermoforming and/or injection moulding sections of the formable film while the deformation-preventing element can prevent/reduce deformation of the film at critical areas.

In a further implementation form of the first aspect, when performing the thermoforming the at least one section of the formable film at the forming temperature, the forming temperature is in the range 130-200° C. The method may enable, for example, efficient thermoforming of the film.

In a further implementation form of the first aspect, the forming temperature is greater than a glass transition temperature of the formable film. The method may enable, for example, efficient thermoforming of the film.

In a further implementation form of the first aspect, the printing the deformation-preventing element onto the formable film comprises: printing a nanopowder ink onto the formable film and sintering the nanopowder; or printing a curable ink onto the formable film and curing the curable ink. The method may enable, for example, printing of the deformation-preventing element with reduced thickness and without needing separate adhesive between the deformation-preventing element and the formable film.

In a further implementation form of the first aspect, the nanopowder comprises a material selected from: silver, gold, silicon, tungsten, titanium oxide, copper, platinum, palladium, aluminium, aluminium oxide, iron oxide, silica, silicon carbide, silicon dioxide, boron nitride, bismuth oxide, bismuth cobalt zinc oxide, nickel, carbon, and any combinations thereof. The method may enable, for example, printing of an appropriate deformation-preventing element for various applications.

In a further implementation form of the first aspect, the curable ink comprises a material selected from: ultraviolet crosslinking polymer inks, thermally cross-linkable polymer inks, and thermosetting inks. The method may enable, for example, efficient curing of the deformation-preventing element.

In a further implementation form of the first aspect, the deformation-preventing element is printed onto a second side of the formable film opposing the first side of the formable film. The method may enable, for example, printing the deformation-preventing element using a conductive material.

In a further implementation form of the first aspect, the formable film comprises a material selected from: polyethylene terephthalate, polycarbonate, polymethyl methacrylate, cyclic olefin copolymer, triacetate, cyclic Olefin Copolymer, poly(vinyl chloride), poly(ethylene 2,6-naphthalate), polyimide, polypropylene, polyethylene, and any combination thereof. The method may enable, for example, efficient forming of the film.

It is to be understood that the implementation forms of the first aspect described above may be used in combination with each other. Several of the implementation forms may be combined together to form a further implementation form.

According to a second aspect, a formed film obtained by the method according to the first aspect is provided.

According to a third aspect, an electronic device comprises the formed film according to the second aspect.

According to fourth aspect, an electronic device comprises: a formable film having a conductive pattern on a first side of the formable film; and a printed deformation-preventing element on the formable film; wherein a modulus of elasticity of the deformation-preventing element at a forming temperature is greater than a modulus of elasticity of the formable film at the forming temperature. With such configurations, the electronic device may, for example, comprise a formed section without the forming negatively affecting the conductive pattern.

In an implementation form of the fourth aspect, the forming temperature is greater than a glass transition temperature of the formable film. With such configurations, the electronic device may, for example, be formed in the forming temperature.

In a further implementation form of the fourth aspect, the deformation-preventing element comprises a material selected from: silver, gold, silicon, tungsten, titanium oxide, copper, platinum, palladium, aluminium, aluminium oxide, iron oxide, silica, silicon carbide, silicon dioxide, boron nitride, bismuth oxide, bismuth cobalt zinc oxide, nickel, carbon, and any combinations thereof. With such configurations, the deformation-preventing element may, for example, be used for various applications.

In a further implementation form of the fourth aspect, the formable film comprises a material selected from: polyethylene terephthalate, polycarbonate, polymethyl methacrylate, cyclic olefin copolymer, triacetate, cyclic Olefin Copolymer, poly(vinyl chloride), poly(ethylene 2,6-naphthalate), polyimide, polypropylene, polyethylene, and any combination thereof. With such configurations, the formable film may, for example, be compatible with various manufacturing methods.

In a further implementation form of the fourth aspect, a thickness of the deformation-preventing element in a direction perpendicular to the formable film is less than 50 micrometres. With such configurations, the deformation-preventing element may, for example, have reduced thickness due to the printing.

In a further implementation form of the fourth aspect, the deformation-preventing element is positioned on a second side of the formable film opposing the first side of the formable film. With such configurations, the deformation-preventing element may, for example, comprise a conductive material without affecting the conductive pattern.

In a further implementation form of the fourth aspect, the deformation-preventing element is positioned to at least partially overlap the conductive pattern. With such configurations, the deformation-preventing element may, for example, reduce deformation of the conductive pattern.

In a further implementation form of the fourth aspect, a distance between the conductive pattern and the deformation-preventing element is less than 10 millimetres. With such configurations, the deformation-preventing element may, for example, reduce deformation of the conductive pattern.

In a further implementation form of the fourth aspect, the conductive pattern comprises at least one set of conductive traces. With such configurations, the conductive pattern may, for example, carry signals for various electronic components.

In a further implementation form of the fourth aspect, the formable film further comprises an electronic component, an optical component, and/or an optoelectronic component attached onto the first side of the formable film and electrically coupled to the conductive pattern. With such configurations, the deformation-preventing element may, for example, prevent the component for detaching during manufacturing.

In a further implementation form of the fourth aspect, the deformation-preventing element is positioned to at least partially overlap the electronic component, the optical component, and/or the optoelectronic component. With such configurations, the deformation-preventing element may, for example, efficiently prevent the component for detaching during manufacturing.

In a further implementation form of the fourth aspect, the formable film is transparent. With such configurations, the formable film may, for example, be suitable for optical and/or photonic applications.

It is to be understood that the implementation forms of the fourth aspect described above may be used in combination with each other. Several of the implementation forms may be combined together to form a further implementation form.

Many of the attendant features will be more readily appreciated as they become better understood by reference to the following detailed description considered in connection with the accompanying drawings.

DESCRIPTION OF THE DRAWINGS

In the following, example embodiments are described in more detail with reference to the attached figures and drawings, in which:

4

Figure 1:
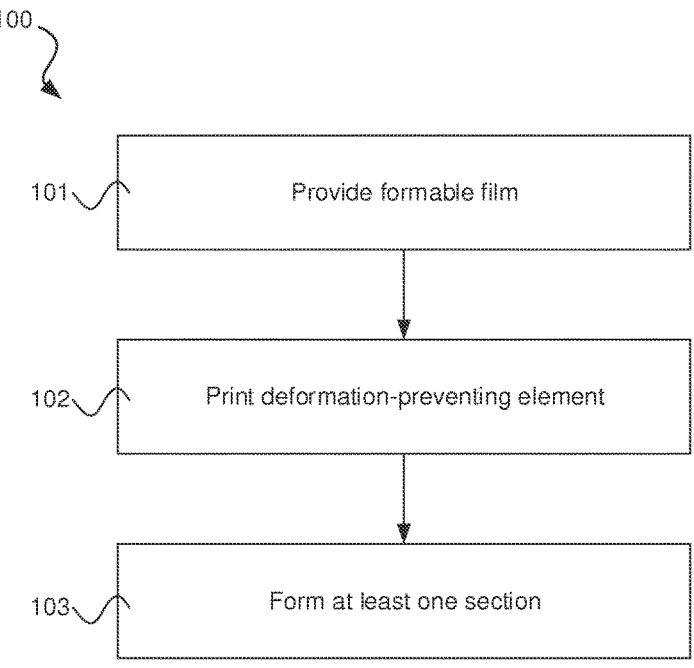
Figure 2:
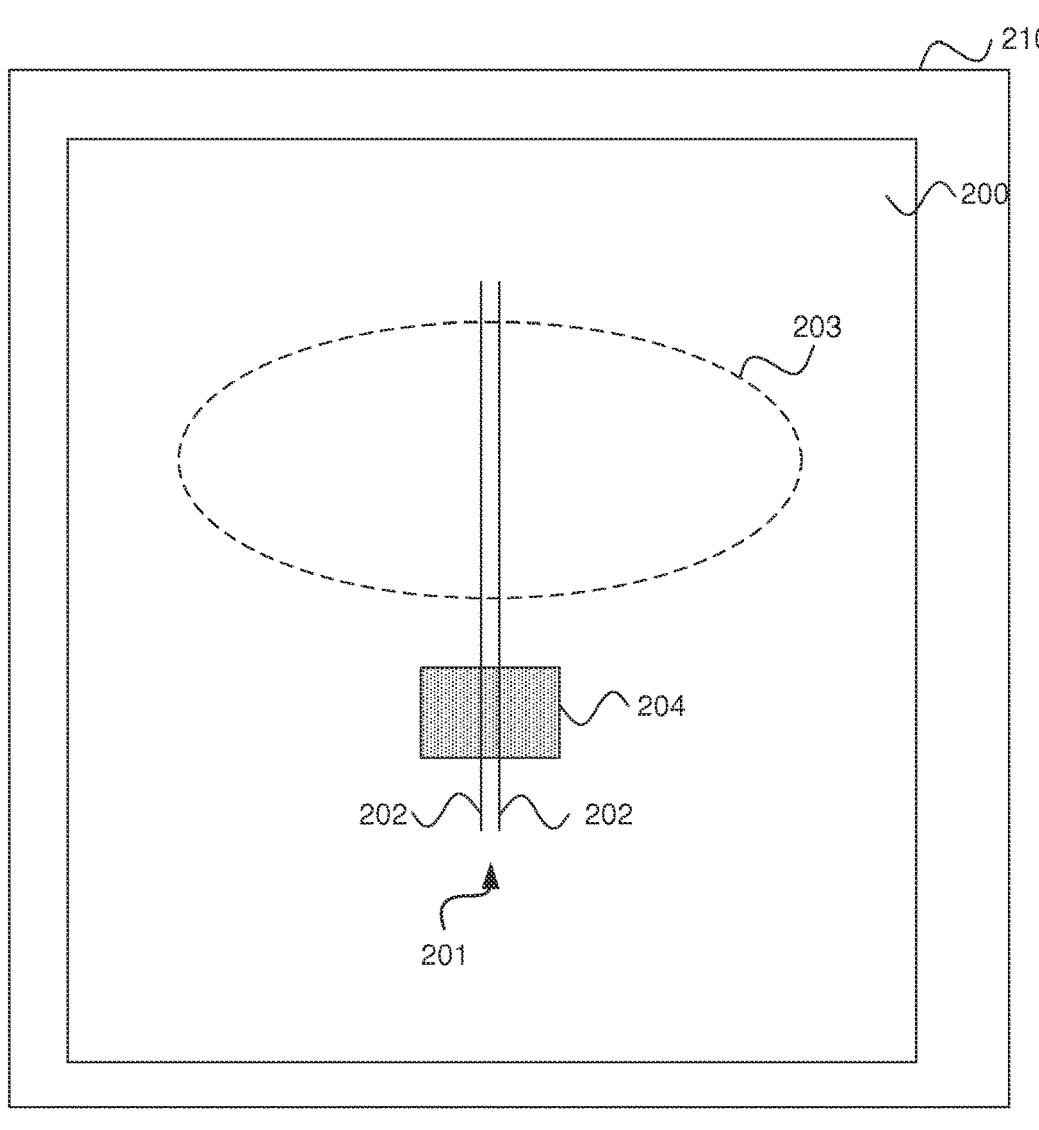
Figure 3:
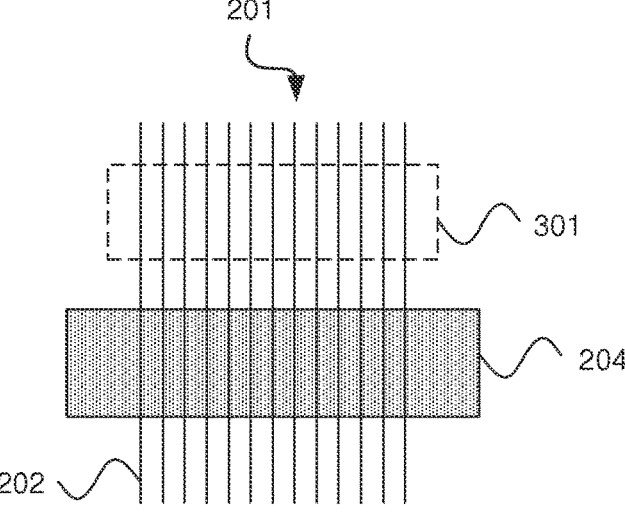
Figure 4:
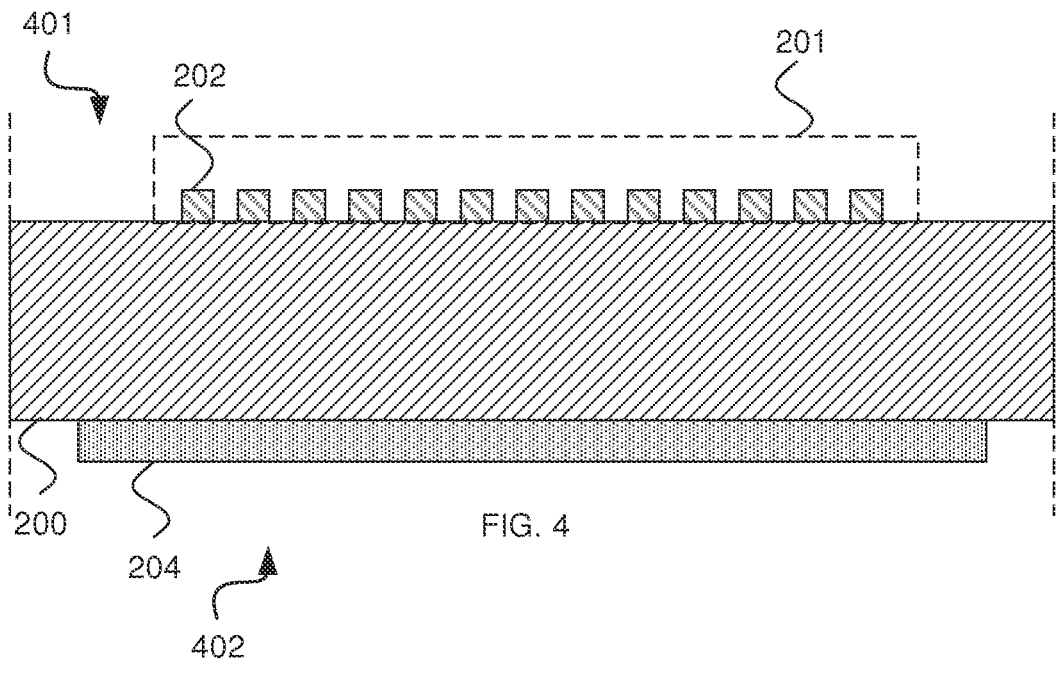
Figure 5:
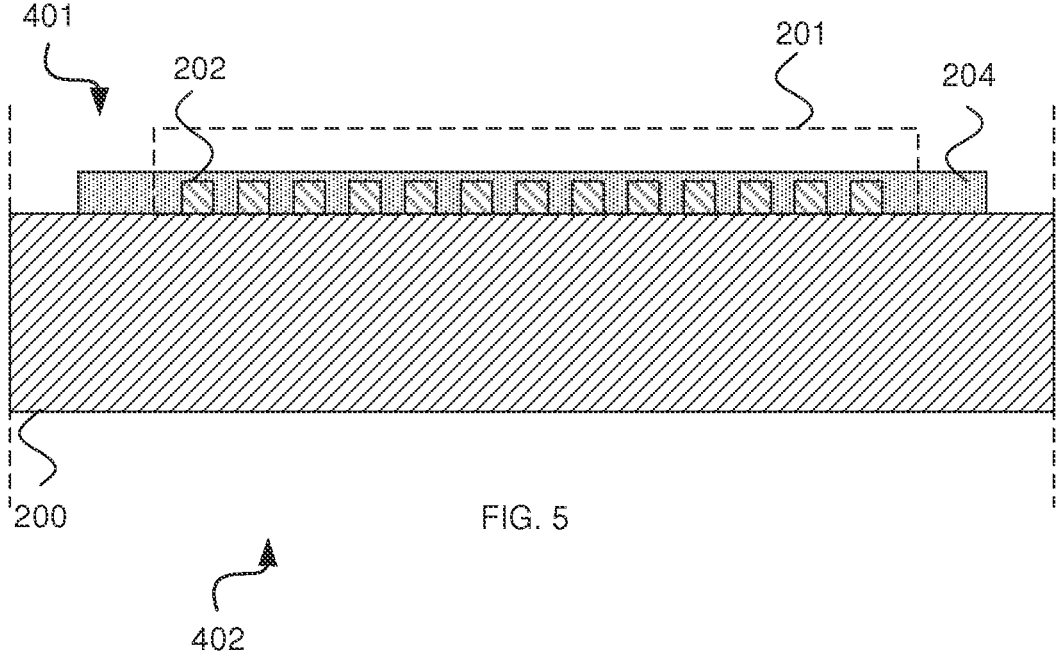
Figure 6:
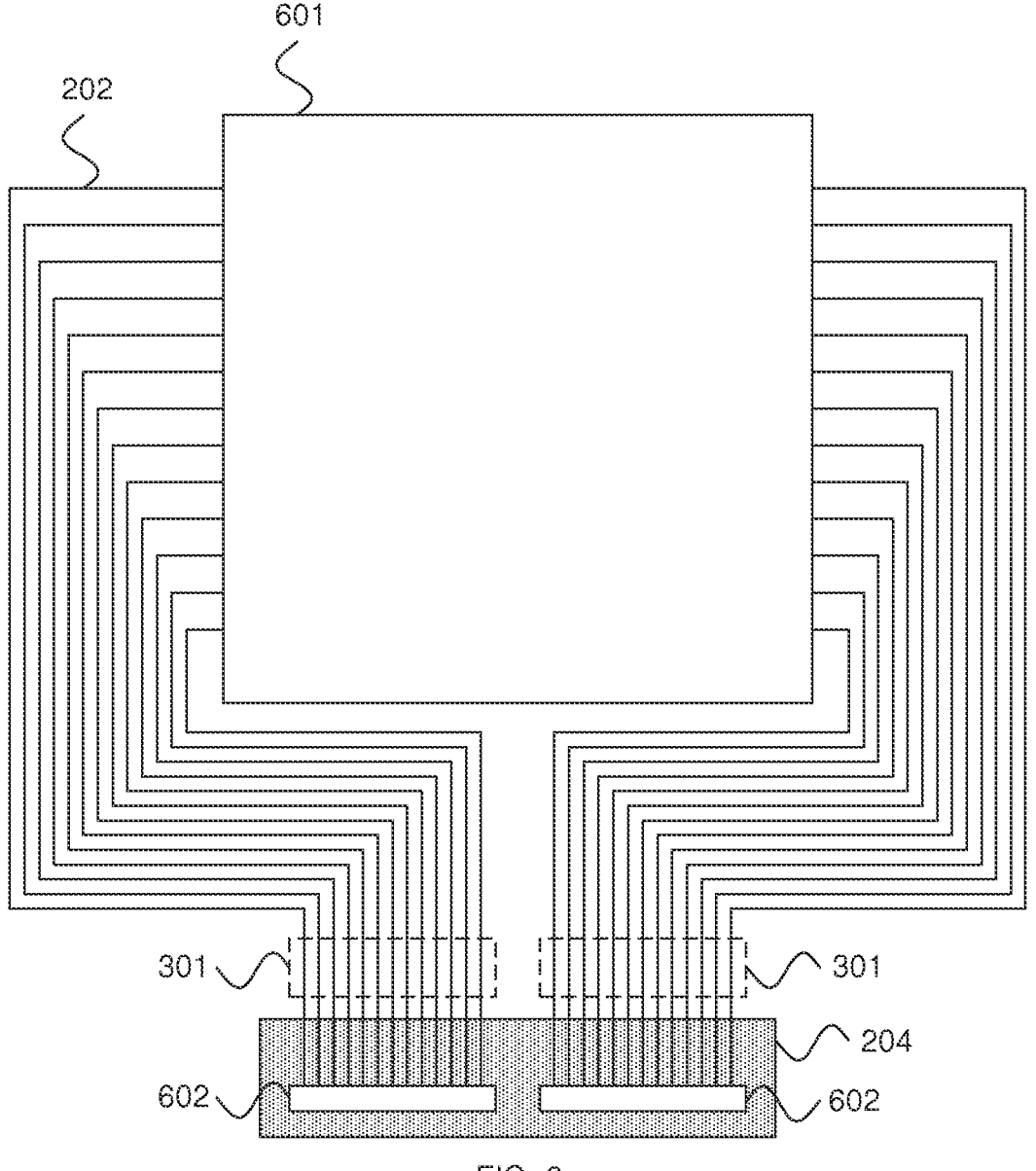
Figure 7:
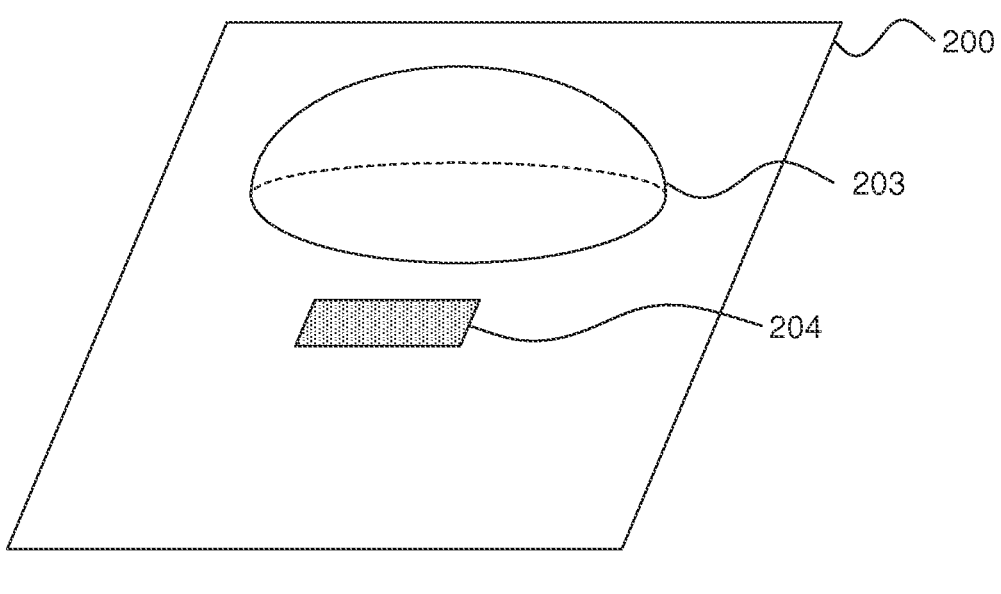
Figure 8:
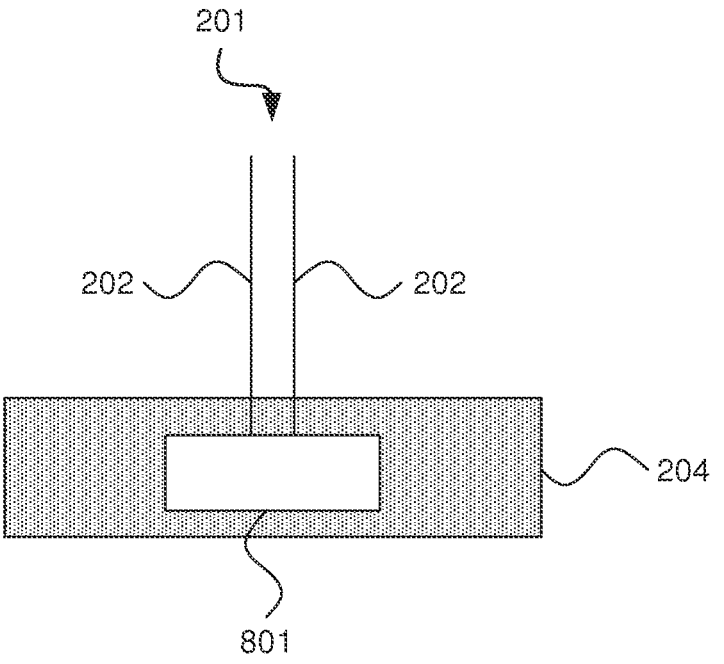

FIG. 1 illustrates a flow chart representation of a method for manufacturing a formed film according to an embodiment;

FIG. 2 illustrates a schematic representation of a formable film according to an embodiment;

FIG. 3 illustrates a schematic representation of a conductive comprising a set of conductive traces pattern according to an embodiment;

FIG. 4 illustrates a cross-sectional representation of a formable film according to an embodiment;

FIG. 5 illustrates a cross-sectional representation of a formable film according to another embodiment;

FIG. 6 illustrates a schematic representation of a touch sensitive-area on a formable film according to an embodiment;

FIG. 7 illustrates a schematic representation of a formed film according to an embodiment; and FIG. 8 illustrates a schematic representation of a component on a formable film according to an embodiment.

In the following, like reference numerals are used to designate like parts in the accompanying drawings.

DETAILED DESCRIPTION

In the following description, reference is made to the accompanying drawings, which form part of the disclosure, and in which are shown, by way of illustration, specific aspects in which the present disclosure may be placed. It is understood that other aspects may be utilised, and structural or logical changes may be made without departing from the scope of the present disclosure. The following detailed description, therefore, is not to be taken in a limiting sense, as the scope of the present disclosure is defined be the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. On the other hand, for example, if a specific apparatus is described based on functional units, a corresponding method may include a step performing the described functionality, even if such step is not explicitly described or illustrated in the figures. Further, it is understood that the features of the various example aspects described herein may be combined with each other, unless specifically noted otherwise.

FIG. 1 illustrates a flow chart representation of a method 100 for manufacturing a formed film.

According to an embodiment, the method 100 comprises providing 101 a formable film having a conductive pattern on a first side of the formable film.

The formable film may also be referred to as a formable layer. The expressions "film" and "layer" should be understood in this specification, unless otherwise stated, as referring to a structure having its lateral dimensions substantially larger than its thickness. In that sense, a film may be considered as being a "thin" structure. A formable film may refer to a film the shape of which can be manipulated using, for example, pressure and/or temperature.

The method 100 may further comprise printing 102 a deformation-preventing element onto the formable film.

The deformation-preventing element may also be referred to as a deformation-reducing element or similar. The deformation-preventing element may not prevent all deformation of the film, rather the deformation-preventing element may reduce the deformation of the film at areas close to the deformation-preventing element. The amount of deformation may be reduced to, for example, a level that is acceptable for a specific application.

The method 100 may further comprise forming 103 at least one section of the formable film at a forming temperature.

Herein, forming may refer to altering the shape of the formable film using, for example, temperature and/or pressure and/or by attaching additional structures to the formable film. Forming may comprise, for example, thermoforming of the formable film and/or injection moulding a structure onto the formable film.

A modulus of elasticity of the deformation-preventing element at the forming temperature may be greater than a modulus of elasticity of the formable film at the forming temperature.

Since the deformation-preventing element and the formable film may be considered to be substantially planar structures, the modulus of elasticity may refer to the modulus of elasticity in that plane. For example, a modulus of elasticity of the deformation-preventing element in the plane of the deformation-preventing element at the forming temperature may be greater than a modulus of elasticity of the formable film in the plane of the formable film at the forming temperature.

Herein, modulus of elasticity may refer to, for example, Young's modulus, shear modulus, and/or bulk modulus of the material in question.

For example, Young's modulus of the deformation-preventing element at the forming temperature may be grater than 100 megapascal (MPa), greater than 200 MPa, greater than 500 MPa, or greater than 1 gigapascal (GPa).

A ratio of the modulus of elasticity of the deformation-preventing element at the forming temperature and the modulus of elasticity of the formable film at the forming temperature may be, for example, greater than 5, greater than 10, greater than 50, greater than $10^2$, greater than $10^3$, or greater than $10^4$. The modulus of elasticity may be measured according to, for example, the standard ISO 527 or the standard JIS K 7161.

Due to the greater modulus of elasticity of the deformation-preventing element, deformation, such as stretching and/or bulging, of the deformable film may be reduced and/or prevented in areas close to the deformation-preventing element. Thus, the deformation-preventing element may help to hold the material dimensions of the formable film at critical, non-formed areas, such as at the location of a sensor or of a heater tail.

A tensile strength of the deformation-preventing element at the forming temperature may be greater than a tensile strength of the formable film at the forming temperature.

According to an embodiment, the forming 103 the at least one section of the formable film at the forming temperature comprises: thermoforming the at least one section of the formable film at the forming temperature; and/or injection moulding a structure onto the formable film.

According to an embodiment, when performing the thermoforming the at least one section of the formable film at the forming temperature, the forming temperature is in the range 130-200° C. Alternatively or additionally, the forming temperature may be in any subrange of this, such as 130-180° C., 150-200° C., or 130-170° C.

According to an embodiment, the forming temperature is greater than a glass transition temperature of the formable film.

Glass transition temperature may refer to a temperature at which an amorphous material, or in amorphous regions within a semicrystalline material, transitions from a hard state into a more viscous or rubbery state as the temperature is increased. The glass transition temperature of a material characterizes the range of temperatures over which this glass transition occurs. The glass transition temperature is usually lower than the melting temperature of the crystalline state of the material. The glass transition temperature may be defined as the temperature at which the dynamic viscosity of the material reaches $10^{12}$ pascal-seconds (Pas).

The glass transition temperature of the formable film may be, for example, in the range 50-130° C. or in any subrange of this, such as 50-100° C., 60-120° C., or 50-90° C.

For example, the glass transition temperature of may be defined to be 70° C. for polyethylene terephthalate and 80° C. for poly(vinyl chloride).

According to an embodiment, the printing the deformation-preventing element onto the formable film comprises: printing a nanopowder ink onto the formable film and sintering the nanopowder; or printing a curable ink onto the formable film and curing the curable ink.

Nanopowder may refer to a solid powder-like substance of artificial origin that comprises nanoobjects, aggregates, and/or agglomerates of nanoobjects or a combination thereof. Alternatively or additionally, nanopowder may refer to a powder, all particles of which are smaller than 100 nanometres. Nanopowder ink may refer to a liquid comprising nanopowder.

The sintering the nanopowder may be performed using, for example, spark plasma sintering, electro sinter forging, pressureless sintering, microwave sintering, liquid phase sintering, solid phase sintering, laser sintering, selective laser sintering, photonic sintering, pulsed thermal processing (PTP), intense pulsed light (IPL) sintering, electron beam melting/sintering, and/or reactive sintering. The type of sintering used may change based on the material of the nanopowder.

The sintering may be performed in a sintering temperature. The sintering temperature may be in the range 60-160° C., or in any subrange of this, such as 60-140° C., 70-130° C., or 100-130° C.

The nanopowder may comprise a material selected from: silver, gold, silicon, tungsten, titanium oxide, copper, platinum, palladium, aluminium, aluminium oxide, iron oxide, silica, silicon carbide, silicon dioxide, boron nitride, bismuth oxide, bismuth cobalt zinc oxide, nickel, carbon, and any combinations thereof.

Curable ink may refer to, for example, a thermosetting ink or an ultraviolet (UV) curable ink. Curing the curable ink may comprise curing the UV curable ink using UV radiation.

According to an embodiment, the curable ink comprises a material selected from: ultraviolet crosslinking polymer inks, thermally cross-linkable polymer inks, and thermosetting inks.

According to an embodiment, the formable film is non-conductive. This can provide insulation of the conductive pattern.

According to an embodiment, the formable film comprises a material selected from: polyethylene terephthalate, polycarbonate, polymethyl methacrylate, cyclic olefin copolymer, triacetate, cyclic Olefin Copolymer, poly(vinyl chloride), poly(ethylene 2,6-naphthalate), polyimide, polypropylene, polyethylene, and any combination thereof.

According to an embodiment, the formable film is transparent. The expression "transparent" should be understood in this specification, unless otherwise stated, as referring to optical transparency of the formable film or the parts and materials thereof in the relevant wavelength range at issue. Transparent material or structure may refer to a material or structure al-lowing light, or generally electromagnetic radiation, at such relevant wavelength to propagate through such material or structure. The relevant wavelength range may depend on the application where the transparent formable film is to be used. In one embodiment, the relevant wavelength range is the visible wavelength range of approximately 390 to about 700 nanometres. In one embodiment, the relevant wavelength range is 850 to 1550 nanometres.

Furthermore, the transparency of the formable film or the parts thereof primarily refers to the transparency in the thickness direction of the formable film or the parts thereof so that in order to be "transparent", sufficient portion of light energy incident on the formable film or a part thereof shall propagate through it in the thickness direction. This portion may depend on the application in which the base film is to be used. In one embodiment, the transmittance of the formable film or the parts thereof is 20-99.99% of the energy of light incident perpendicularly on the laminated film, at a location where the transparent conductor material is present. In one embodiment, said transmittance is 20% or higher, or 30% or higher, or 40% or higher, or 50% or higher, or 60% or higher, or 70% or higher, or 80% or higher, 90% or higher. The transmittance may be measured according to standard JIS-K7361, ASTM D1003.

According to an embodiment, the conductive pattern comprises a network of conductive high aspect ratio molecular structures (HARM-structures).

A conductive "HARM structure" may refer to electrically conductive "nanostructures", i.e. structures with one or more characteristic dimensions in nanometre scale, for example less than or equal to about 100 nanometres. "High aspect ratio" may refer to dimensions of the conductive structures in two perpendicular directions being in significantly different orders of magnitude. For example, a nanostructure may have a length which is tens or hundreds of times greater than its thickness and/or width. In a HARM-structure network, a great number of said nanostructures are interconnected with each other to form a network of electrically interconnected molecules. As considered at a macroscopic scale, a HARMS network forms a solid, monolithic material in which the individual molecular structures are disoriented or unoriented, i.e. are oriented substantially randomly, or oriented. Various types of HARMS networks can be produced in the form of thin transparent layers with reasonable resistivity.

In one embodiment, the conductive HARM-structures comprise metal nanowires, such as silver nanowires or copper nanowires.

In one embodiment, the conductive HARM-structures network comprises carbon nanostructures. In one embodiment, the carbon nanostructures comprise carbon nanotubes, carbon nanobuds, carbon nanoribbons, carbon nanofibers or any combination thereof. In one embodiment, the carbon nanostructures comprise carbon nanobuds, i.e. carbon nanobud molecules. The carbon nanobuds or the carbon nanobud molecules, have fullerene or fullerene-like molecules covalently bonded to the side of a tubular carbon molecule. Carbon nanostructures, especially carbon nanobuds, may provide advantageous both from electrical, optical (transparency), and mechanical (robustness combined with flexibility and/or deformability) points of view.

According to an embodiment, the conductive pattern comprises at least one set of conductive traces. The conductive traces can be used in a variety of layered electronic devices.

FIG. 2 illustrates a schematic representation of a formable film 200 according to an embodiment.

According to an embodiment, an electronic device 210 comprises a formable film 200 having a conductive pattern 201 on a first side of the formable film 200 and a printed deformation-preventing element 204 on the formable film 200.

The electronic device 210 also be referred to as an in-mould electronic device.

The printed deformation-preventing element 204 may also be referred to as a deformation-preventing element, a deformation-reducing element, or similar. The printed deformation-preventing element 204 may be at least partially in contact with the formable film 200 and/or the printed deformation-preventing element 204 may be at least partially in contact with the conductive pattern 201. The printed deformation-preventing element 204 may be adhered to the formable film due to the printing.

Since the deformation-preventing element 204 is printed, no additional adhesive may be needed between the deformation-preventing element 204 and the formable film 200. Furthermore, thickness of the deformation-preventing element 204 may be reduced compared to other methods.

The formable film 200 may also be referred to as a formed film. This may indicate that at least one section of the formable film has been formed. However, even if some section of the formable film has been formed, some other section of the formable/formed film 200 may be formed at a later point in time.

A modulus of elasticity of the deformation-preventing element 204 at a forming temperature may be greater than a modulus of elasticity of the formable film 200 at the forming temperature.

The forming temperature may be greater than an operating temperature of the electronic device 210. Operating temperature may refer to a temperature in which the electronic device 210 usually operates in and/or has been deigned to operate in. The operating temperature may be, for example, in the range −50-50° C.

The deformation-preventing element 204 may be configured to prevent/reduce deformation of the formable film 200 at the location and/or close to the location of the deformation-preventing element 204.

According to an embodiment, the conductive pattern 201 comprises at least one set of conductive traces 202. In the embodiment of FIG. 2, for example, the conductive pattern 201 comprises two traces 202. The embodiment of FIG. 2 is only exemplary and a set of conductive traces 202 may comprise any number of conductive traces 202.

The formable film 200 may further comprise at least one section 203 to be formed. The at least one section 203 may be formed using, for example, thermoforming and/or injection moulding. The shape of the at least one section 203 may vary and the embodiments described herein are only exemplary. The at least one section 203 may also be referred to as at least one formed section, when the forming has been completed.

As the at least one section 203 is formed, also areas outside the section 203 may deform. Due to the deformation, the distance between the conductive traces 202 of the conductive pattern 201 may change in areas close to the formed section 203. This may be problematic when, for example, a connector is to be attached to the conductive traces 202, since the pins of the connector may not align with the conductive traces 202.

The formable film 200 may comprise a printed deformation-preventing element 204. The deformation-preventing element 204 may prevented or reduce deformation of the deformable film 200 in areas close to the deformation preventing element 204. Thus, in areas of the formable film 200 close to the deformation-preventing element 204, the distance between the conductive traces 202 of the conductive pattern 201 may not change significantly.

According to an embodiment, a thickness of the deformation-preventing element 204 in a direction perpendicular to the formable film is less than 50 micrometres (µm). Alternatively or additionally, the thickness of the deformation-preventing element 204 may be less than 20 µm, less than 10 µm, less than 5 µm, less than 1 µm, and/or less than 0.5 µm.

Although the deformation-preventing element 204 may overlap the conductive pattern 201 in some embodiments, this may not generally be the case. The deformation-preventing element 204 may be positioned close to the conductive pattern 201.

According to an embodiment, a distance between the conductive pattern 201 and the deformation-preventing element 204 is less than 10 millimetres (mm). Alternatively or additionally, the distance may be less than 5 mm, less than 2 mm, less than 1 mm, less than 500 µm, less than 100 µm, and/or less than 10 µm.

According to an embodiment, the deformation-preventing element 204 is positioned to at least partially overlap the conductive pattern 201. Herein, "overlap" may mean that a projection of the conductive pattern onto the plane of the formable film 200 overlaps a projection of the conductive pattern 201 onto the plane of the formable film 200, i.e. these projections have at least some common section in the plane. Thus, the deformation-preventing element 204 may overlap the conductive pattern 201 even if the deformation-preventing element 204 and the conductive pattern are positioned onto opposing sides of the formable film 200.

The electronic device 210 and/or the formable film 200 may be embodied in, for example, touch sensors, user-interfaces in vehicles, in heater elements, in so-lar panels, in sensors, in chemical sensors, in medical equipment, in displays, and/or in lighting equipment.

FIG. 3 illustrates a schematic representation of a conductive pattern 201 according to an embodiment.

The conductive pattern 201 may comprise at least one set 301 of conductive traces 202. A set of conductive traces may comprise a plurality of conductive traces 202. The conductive traces 202 may be substantially parallel.

As the formable film 200 is formed, the pitch between the conductive traces 202 may change. This may be problematic when, for example, a connector is to be attached to the set 301 of conductive traces 202, since the pins of the connector may not align with the conductive traces 202. This problem may become more severe, when the number of traces 202 is large and/or when the pitch between the traces 202 is small.

The deformation-preventing element 204 may keep the pitch between the conductive traces 202 substantially constant by reducing the deformation of the formable film 200 in areas close to the deformation-preventing element 204.

FIG. 4 illustrates a cross-sectional view of a formable film 200 according to an embodiment. The formable film 200 may comprise a first side 401 and a second side 402. The second side 402 may be opposing the first side 401.

The conductive pattern 201 may be positioned on the first side 401 of the formable film 200.

According to an embodiment, the deformation-preventing element 204 is positioned on a second side 402 of the formable film 200 opposing the first side 401 of the formable film 200. For example, the deformation preventing element 204 may be printed onto the second side 402 of the formable film 200.

FIG. 5 illustrates a cross-sectional view of a formable film 200 according to another embodiment.

In some embodiments, the conductive pattern 201 and the deformation-preventing element 204 may be positioned on the first side 401 of the formable film 200. For example, the deformation-preventing element 204 may be printed onto the first side 401 of the formable film 200.

The conductive pattern 201 and the deformation-preventing element 204 may be positioned onto the same side of the formable film 200. This may be the case, for example, if the deformation-preventing element 204 is non-conductive so that it does not affect signals carried by the traces 202 of the conductive pattern 201. Alternatively, or additionally, an additional non-conductive layer/coating may be positioned between the conductive pattern 201 and the deformation-preventing element 204.

The cross-sectional geometry and/or dimensions presented in the embodiments of FIG. 4 and FIG. 5 are only exemplary and may not reflect actual geometry and/or dimensions of the parts presented.

FIG. 6 illustrates a schematic representation of a touch sensitive-area 601 on a formable film 200 according to an embodiment. The conductive pattern in the embodiment of FIG. 6 comprises two sets 301 of conductive traces 202. The conductive traces 202 may carry a signal from the touch-sensitive area 601. The touch-sensitive area 601 may comprise, for example, a capacitive touch interface. The conductive traces 202 may be electrically coupled to connectors 602. Using the connectors 602, the signals from the conductive traces 202 may be fed into other devices and/or components.

The at least one section 203 to be formed may comprise the touch-sensitive area 601. This way, the touch sensitive area 601 can be formed into various shapes for different user-interface applications.

Since the forming of the film may also deform areas outside the formed at least one section 203, the pitch between the conductive traces 202 may change. Due to this, the pins of the connectors 602 may not align with the conductive traces 202. This may require running the conductive traces 202 further away from the formed at least one section 203 and place the connectors 602 further away from the formed section 203.

The deformation-preventing element 402 may be placed close to the formed section 203. Since the deformation-preventing element 402 reduces the deformation of the film outside the formed section 203, the pitch of the conductive traces 202 is not significantly altered by the forming. Thus, the connectors 402 can be placed closer to the formed section 203, and total foot print of the conductive traces 202 can be reduced.

FIG. 7 illustrates a perspective view of a formed film 200 according to an embodiment. The formed section 203 illustrated in the embodiment of FIG. 7 has been formed into a substantially semi-spherical shape. The semi-spherical shape may comprise, for example, a touch-sensitive interface 601 similar to that presented in the embodiment of FIG. 6. The deformation-preventing element 204 may be placed closed to the formed section 203.

FIG. 8 illustrates a schematic representation of a component 801 on a formable film 200 according to an embodiment.

According to an embodiment, the formable film 200 further comprises an electronic component (such as an integrated circuit), an optical component (such as a light guide), a flexible cable, a flexible printed circuit board and/or an optoelectronic component (such as an LED) attached onto the first side of the formable film and electrically coupled to the conductive pattern 201.

The component 801 may comprise, for example, an electronic component, an optical component, and/or an optoelectronic component. The component 801 may be electrically coupled to the conductive pattern 201. The conductive traces 202 of the conductive pattern 201 may provide a driving signal for the component 801.

According to an embodiment, the deformation-preventing element is positioned to at least partially overlap the electronic component, the optical component, and/or the optoelectronic component.

The component 801 may detach from the formable film 200 during the forming due to the deforming of the formable film 200. A deformation-preventing element 204 may be printed/positioned closed to the component 801 to prevent the deformation of the formable film 200 at the location of the component 801. The deformation-preventing element 204 may even overlap the component 801 as is illustrated in the embodiment of FIG. 8.

Although only some components and features of the formable film 200 have been disclosed in the embodiments herein, a formable film 200 may comprise any number of components and other features. For example, a formable film 200 may comprise a plurality of sections 203 that can be formed. A formable film 200 may also comprise a plurality of components 801 and sets 301 of conductive traces 202 that may be interconnected in various ways depending on the application.'

According to an embodiment, the electronic device 210 further comprises a second conductive pattern attached to a surface of a second formable film facing a first formable film, wherein the conductive pattern attached to the surface of the first formable film facing the second formable film is a first conductive pattern. This embodiment provides a device with at least two conductive patterns facing each other and attached to opposite formable films.

According to alternative embodiments, the second conductive pattern may be attached to an opposite side of the first formable film or opposing side of the second formable film.

According to an embodiment, the first and second conductive patterns are aligned to be separated in the plane of the parallel first and second formable films. In this embodiment the conductive patterns are brought apart so that they can be insulated from each. For example, in an application such as a touch sensor, the electrodes may be in different planes and not overlap.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A method for manufacturing a formed film, device comprising steps of:
   providing a formable film having a first side and a second side;
   forming a conductive pattern onto a first side of the formable film;
   forming a deformation-preventing element on the second side of the formable film by printing a nanopowder ink onto the formable film and sintering the nanopowder, wherein the deformation-preventing element is printed on the second side of the formable film opposing the first side of the formable film; and
   forming at least one section of the formable film at a forming temperature;
   wherein the providing of the formable film comprises forming at least one section of the formable film at a forming temperature; and
   wherein a modulus of elasticity of the deformation-preventing element at the forming temperature is greater than a modulus of elasticity of the formable film at the forming temperature to obtain the formed film device.

2. The method according to claim 1, wherein the forming the at least one section of the formable film at the forming temperature comprises at least one of:
   thermoforming the at least one section of the formable film at the forming temperature; and
   injection moulding the at least one section of the formable film at the forming temperature.

3. The method according to claim 2, wherein, in the the thermoforming the at least one section of the formable film at the forming temperature, the forming temperature is in the range 130-200° C.

4. The method according to claim 1, wherein the forming temperature is greater than a glass transition temperature of the formable film.

5. The method according to claim 1, wherein the nanopowder comprises a material selected from: silver, gold, silicon, tungsten, titanium oxide, copper, platinum, palladium, aluminium, aluminium oxide, iron oxide, silica, silicon carbide, silicon dioxide, boron nitride, bismuth oxide, bismuth cobalt zinc oxide, nickel, carbon, and any combinations thereof.

6. The method according to claim 1, wherein the formable film comprises a material selected from: polyethylene terephthalate, polycarbonate, polymethyl methacrylate, cyclic olefin copolymer, triacetate, cyclic Olefin Copolymer, poly (vinyl chloride), poly(ethylene 2,6-naphthalate), polyimide, polypropylene, polyethylene, and any combination thereof.

7. The method according to claim 1, wherein a thickness of the deformation-preventing element in a direction perpendicular to the formable film is less than 50 micrometres.

8. The method according to claim 1, wherein the deformation-preventing element is positioned to at least partially overlap the conductive pattern.

9. The method according to claim 1, wherein a distance between the conductive pattern and the deformation-preventing element is less than 10 millimetres.

10. The method according to claim 1, wherein the conductive pattern comprises at least one set of conductive traces.

11. The method according to claim 1, wherein the formable film further comprises an electronic component, an optical component, a flexible cable, a flexible printed circuit board, and/or an optoelectronic component attached onto the first side of the formable film and electrically coupled to the conductive pattern.

12. The method according of claim 1, wherein the formation preventing element is positioned to at least partially overlap the electronic component, the optical component, the flexible cable, the flexible printed circuit board and/or the optoelectronic component.

13. The method according to claim 1, wherein the formable film is transparent.

* * * * *